United States Patent
Cho et al.

(10) Patent No.: US 8,864,338 B2
(45) Date of Patent: Oct. 21, 2014

(54) HEAT RADIATING PRINTED CIRCUIT BOARD AND CHASSIS ASSEMBLY HAVING THE SAME

(75) Inventors: Inhee Cho, Seoul (KR); Jaeman Park, Seoul (KR); Hyungyu Park, Seoul (KR); Eunjin Kim, Seoul (KR); Haehyung Lee, Seoul (KR); Jungho Lee, Seoul (KR); Hyuksoo Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 269 days.

(21) Appl. No.: 13/500,752

(22) PCT Filed: Oct. 8, 2010

(86) PCT No.: PCT/KR2010/006905
§ 371 (c)(1),
(2), (4) Date: Jul. 2, 2012

(87) PCT Pub. No.: WO2011/043625
PCT Pub. Date: Apr. 14, 2011

(65) Prior Publication Data
US 2012/0268968 A1 Oct. 25, 2012

(30) Foreign Application Priority Data
Oct. 8, 2009 (KR) .................. 10-2009-0095846

(51) Int. Cl.
| | |
|---|---|
| F21V 29/00 | (2006.01) |
| H05K 3/00 | (2006.01) |
| G02F 1/1333 | (2006.01) |
| H05K 1/02 | (2006.01) |
| H05K 1/05 | (2006.01) |
| G02F 1/1335 | (2006.01) |
| F21V 8/00 | (2006.01) |

(52) U.S. Cl.
CPC .. *H05K 3/0061* (2013.01); *G02F 2001/133314* (2013.01); *H05K 1/0284* (2013.01); *H05K 1/05* (2013.01); *G02F 2001/133628* (2013.01); *H05K 2201/10106* (2013.01); *G02B 6/0085* (2013.01); *H05K 2203/302* (2013.01)
USPC ...... 362/294; 362/611; 362/249.02; 362/612; 361/749; 174/266

(58) Field of Classification Search
CPC ........................... G02B 6/0073; G02B 6/0085
USPC ............... 362/611, 612, 613, 249.03, 249.04; 361/749; 174/266
See application file for complete search history.

(56) References Cited

U.S. PATENT DOCUMENTS

| | | | |
|---|---|---|---|
| 6,166,788 A | 12/2000 | Ha et al. | |
| 7,530,723 B2 * | 5/2009 | Ohno | ............................ 362/613 |

(Continued)

FOREIGN PATENT DOCUMENTS

| | | |
|---|---|---|
| CN | 101165570 A | 4/2008 |
| EP | 1874101 A1 | 1/2008 |

(Continued)

OTHER PUBLICATIONS
International Search Report in International Application No. PCT/KR2010/006905, filed Oct. 8, 2010.

(Continued)

*Primary Examiner* — Ali Alavi
(74) *Attorney, Agent, or Firm* — Ked & Associates, LLP

(57) ABSTRACT

The present invention relates to a heat radiating printed circuit board (PCB) and a chassis assembly having the same, the heat-radiating PCB characterized by: a circuit pattern unit mounted with a light emitting diode; and one or more mounting units bent from the circuit pattern unit to be fixed at a chassis providing a lightguide path of a backlight unit, where one of the mounting units is mounted to the chassis via a thermal interface material to maximize the heat radiating characteristic of the PCB and to reduce the manufacturing cost.

20 Claims, 2 Drawing Sheets

(56) References Cited

U.S. PATENT DOCUMENTS

| | | | |
|---|---|---|---|
| 7,784,989 B2* | 8/2010 | Shin | 362/628 |
| 8,058,782 B2* | 11/2011 | Lai | 313/46 |
| 8,123,381 B1* | 2/2012 | Wray | 362/294 |
| 8,222,820 B2* | 7/2012 | Wang et al. | 315/32 |
| 2006/0114694 A1* | 6/2006 | Cho et al. | 362/631 |
| 2007/0103904 A1* | 5/2007 | Chen | 362/276 |
| 2007/0139961 A1 | 6/2007 | Cheah et al. | |
| 2008/0130289 A1* | 6/2008 | Takemoto et al. | 362/294 |
| 2009/0032295 A1 | 2/2009 | Okajima et al. | 174/260 |
| 2009/0116262 A1* | 5/2009 | Park | 362/612 |
| 2009/0323346 A1* | 12/2009 | Chang | 362/294 |
| 2013/0194825 A1* | 8/2013 | Nam et al. | 362/613 |

FOREIGN PATENT DOCUMENTS

| | | |
|---|---|---|
| JP | 2004-279262 A | 10/2004 |
| JP | 2007-193946 A | 8/2007 |
| JP | 2007-194155 A | 8/2007 |
| JP | 4211029 B2 | 1/2009 |
| JP | 2009-158646 A | 7/2009 |
| KR | 10-1997-0078227 A | 11/1998 |
| KR | 10-2000-0050959 A | 8/2000 |
| KR | 10-2007-0053517 A | 5/2007 |
| KR | 10-2008-0013411 A | 2/2008 |
| TW | 200823537 A | 6/2008 |

OTHER PUBLICATIONS

Supplementary European Search Report dated Sep. 3, 2013 in European Application No. 10822270.4, filed Oct. 8, 2010.
Office Action dated Dec. 22, 2012 in Taiwanese Application No. 099134394, filed Oct. 8, 2010.
Chinese Office Action dated Mar. 28, 2014 issued in Application No. 201080055720.8 (English Translation only).
Japanese Office Action dated Apr. 1, 2014 issued in Application No. 2012-533088.

* cited by examiner

HEAT RADIATING PRINTED CIRCUIT BOARD AND CHASSIS ASSEMBLY HAVING THE SAME

CROSS-REFERENCE TO RELATED APPLICATION

This application is the U.S. national stage application of International Patent Application No. PCT/KR2010/006905, filed Oct. 8, 2010, which claims priority to Korean Application No. 10-2009-0095846, filed Oct. 8, 2009, the disclosures of each of which are incorporated herein by reference in their entirety.

TECHNICAL FIELD

The present invention relates to a heat radiating printed circuit board and a chassis assembly having the same.

BACKGROUND ART

The LCD (liquid crystal display) is an electrical element that applies to a display device electrical/optical properties of liquid crystal having intermediate physical properties between a solid and a liquid, and displays an image by controlling the amount of light transmitting the liquid crystal.

That is, the LCD is an electrical element that uses a change in transmissivity of the liquid crystal responsive to an applied voltage and changes various electrical information generated by various devices to visual information and transmits the visual information in visual images.

Since the LCD is not a self-illuminating display device, the LCD essentially requires light from an exterior source to display the images. In order to supply the light to the LCD, the LCD includes a BLU (backlight unit) disposed at a rear surface of the LCD as a light source. The BLU is a composite body including a power source circuit for driving the light source and other accessories providing an even plane light source.

The BLU is mounted with a light source such as an LED (light emitting diode) and a PCB (printed circuit board) largely employs a metal material for sustaining heat radiated from a light source element. However, if the heat generated by the light source element is not properly dissipated, there is a risk of the light source element being broken and shortened in life.

FIG. 1 is a cross-sectional view of a heat-radiating PCB 10 and a bracket 40 mounted at a chassis 50 which is lightguide path of a backlight unit.

Referring to FIG. 1, the bracket 40 for fixing the heat-radiating PCB 10 to the chassis 50 is separately prepared, and bonded using TIM (thermal interface material 20). That is, the heat-radiating PCB and the bracket are bonded to the chassis used as a lightguide path using the TIM 20.

However, in a case the heat-radiating PCB 10 and the bracket 40 are separately manufactured and bonded using the TIM 20, there is a disadvantage of the degraded Heat Transfer Coefficient (Ratio) caused by the TIM 20 to decrease the heat-radiating effect. There is another disadvantage in that adhesion problem between the heat-radiating PCB 10 and the bracket 50 occurs to create a decreased quality.

DISCLOSURE

Technical Problem

The present invention is disclosed to obviate the above-mentioned disadvantages, and it is an object to provide a heat-radiating PCB (printed circuit board) and a chassis assembly having the same capable of integrating the heat-radiating PCB and a bracket for maximization of heat-radiating characteristics, and simplifying the structure for reduced material cost.

It is another object to provide a heat-radiating PCB (printed circuit board) and a chassis assembly having the same capable of preventing the heat-radiating PCB from separating from a bracket to minimize the occurrence of quality failure.

Additional advantages, objects, and features of the present invention will be set forth in part in the description which follows and in part will become apparent to those having ordinary skill in the art upon examination of the following or may be learned from practice of the invention. It is to be understood that both the foregoing general description and the following detailed description of the present invention are exemplary and explanatory and are intended to provide further explanation of the invention as claimed.

Technical Solution

In one general aspect of the present invention, there is provided a heat-radiating PCB (printed circuit board), characterized by: a circuit pattern unit mounted with a light emitting diode; and one or more mounting units bent from the circuit pattern unit to be fixed at a chassis providing a lightguide path of a backlight unit, where one of the mounting units is mounted to the chassis via a thermal interface material.

In some exemplary embodiments, the circuit pattern unit may be mounted with a metal substrate sequentially formed with an insulation layer and a circuit pattern, and a light emitting diode.

In some exemplary embodiments, the metal substrate may be an Al substrate.

In some exemplary embodiments, the mounting unit may be formed by bending the metal substrate of the circuit pattern unit.

In some exemplary embodiments, the mounting unit may include a first mounting unit bent from a distal end of the circuit pattern unit to be mounted at a lateral surface of the chassis, and a second mounting unit bent from the other distal end of the circuit pattern unit to be mounted at a floor surface of the chassis.

In some exemplary embodiments, an angle between the first mounting unit and the circuit pattern unit may be a right angle, and an angle between the second mounting unit and the circuit pattern unit may be also a right angle.

In some exemplary embodiments, an angle between the first mounting unit and the circuit pattern unit may be an acute angle or an obtuse angle, and an angle between the second mounting unit and the circuit pattern unit may be a right angle.

In some exemplary embodiments, the first mounting unit and the second mounting unit may be bent in opposite direction.

In some exemplary embodiments, the first mounting unit and the second mounting unit may be bent to face in the same direction.

In another general aspect of the present invention, there is provided a chassis assembly, characterized by: a chassis providing a lightguide path of a backlight unit; and a heat-radiating PCB mounted at the chassis, where the heat-radiating PCB includes a circuit pattern unit mounted with a light emitting diode, and one or more mounting units bent from the circuit pattern unit to be fixed at a chassis providing a lightguide path of a backlight unit, and where one of the mounting units is mounted to the chassis via a thermal interface material.

Advantageous Effects

The heat-radiating PCB (printed circuit board) and a chassis assembly having the same according to the present invention have advantageous effects in that the heat-radiating PCB and a bracket are integrated to prevent degraded heat transfer caused by use of TIM (thermal interface material) and to reduce generation of interface, whereby a thermal conduction degradation phenomenon caused by an air layer can be prevented to maximize the heat-radiating characteristics of the heat-radiating PCB.

Another advantageous effect is that a bracket is integrally manufactured with the heat-radiating PCB to simplify the structure and process by dispensing with separate bracket manufacturing process.

Still another advantageous effect is that the TIM is dispensed with between the heat-radiating PCB and the bracket to reduce use of the TIM and to dispense with the bracket, thereby reducing the manufacturing cost.

Still further advantageous effect is that generation of delamination caused by adhesion problem between the PCB and the bracket can be dispensed with.

MODE FOR INVENTION

Figure 1:
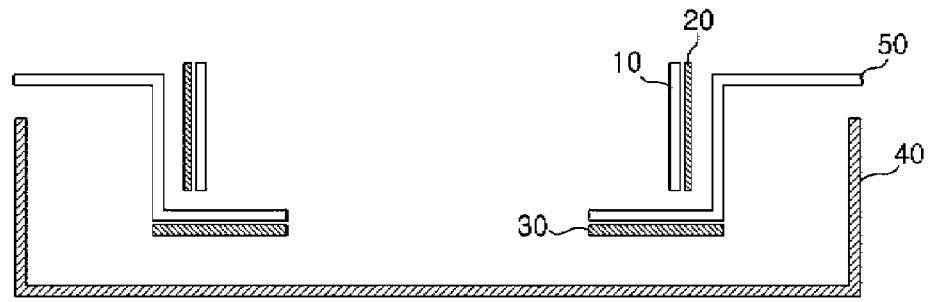
FIG. 1 is a cross-sectional view of a heat-radiating PCB and a bracket mounted at a chassis which is lightguide path of a backlight unit.

In the drawings, the size and relative sizes of constituent elements may be exaggerated for clarity and convenience. Furthermore, in describing the present disclosure, detailed descriptions of constructions or processes known in the art may be omitted to avoid obscuring appreciation of the invention by a person of ordinary skill in the art with unnecessary detail regarding such known constructions and functions. Accordingly, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

Figure 2:
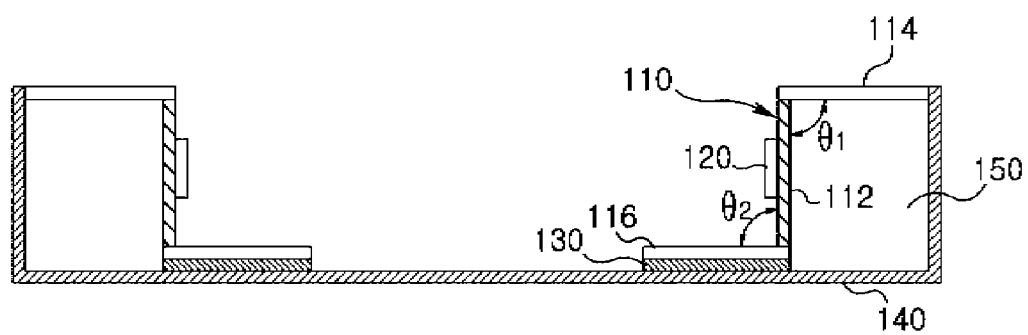
FIG. 2 is a cross-sectional view illustrating a chassis assembly mounted with a heat-radiating PCB according to a first exemplary embodiment of the present invention.

FIG. 2 is a cross-sectional view illustrating a chassis assembly mounted with a heat-radiating PCB according to a first exemplary embodiment of the present invention. Referring to FIG. 2, a chassis assembly according to an exemplary embodiment of the present invention includes a chassis 140 and a heat-radiating printed circuit board (PCB) 110 mounted on the chassis 140.

The heat-radiating printed circuit board (PCB) 110 includes a circuit pattern unit 112 and mounting units 114, 116, where the circuit pattern unit 112 includes a metal substrate sequentially formed with an insulation layer and a circuit pattern, and a chip mounting unit mounted with a light emitting diode 120.

The chip mounting unit mounted at the circuit pattern unit 112 of the heat-radiating PCB 110 is formed with the light emitting diode 120 as a light source for the backlight unit. Although the chip mounting unit is preferably mounted with a light emitting diode as a light emitting source, the embodiment is not limited thereto. The embodiment may be applied to where other light emitting sources are mounted as a light source.

The metal substrate is preferably formed with an aluminum material and the embodiment is not limited thereto. That is, the heat-radiating PCB 110 may be formed in such a manner that an insulation layer and a circuit pattern are sequentially formed on the metal substrate to form a circuit pattern unit, and both ends of the metal substrate is bent to form mounting units 114,116.

The mounting units 114,116 are areas where the circuit pattern unit 112 is not formed, and may include a first mounting unit 114 bent from an upper surface of the circuit pattern unit 112 to be fixed at a lateral surface of the chassis 140, and a second mounting unit 130 bent at a bottom surface of the circuit pattern unit 112 to be fixed at a floor surface of the chassis 140.

That is, the mounting units 114,116 form the first mounting unit 114 where one side of the metal substrated is bent to one direction to form the first mounting unit 114, the other side of the metal substrated is bent to the other direction to form the second mounting unit 116.

The first mounting unit 114 and the second mounting unit 116 may be bent in opposite direction from each other. The first mounting unit 114 is fixed at a distal end thereof to a lateral surface of the chassis 140, while the second mounting unit 116 is fixed at the floor surface of the chassis 140.

The second mounting unit 116 may be bonded to the floor surface of the chassis 140 using thermal interface material (TIM) 130 an adhesive, a double-sided tape or other bonding materials or configurations may be used to bond the second mounting unit 116 and the chassis 140 in addition to the TIM 130.

In a case the heat-radiating PCB 110 is installed at the chassis 140, a space 150 may be formed between the heat-radiating PCB 110 and the chassis 140.

A right angle θ1 is formed between the first mounting unit 114 and the circuit pattern unit 112 and another right angle θ2 is also formed between the second mounting unit 116 and the circuit pattern unit 112. The embodiment is just an example and the angles θ1,θ2 should not be right angles between the two mounting units 114,116 and the circuit pattern unit 112.

As apparent from the foregoing, the heat-radiating PCB according to the present invention is integrally formed with mounting units for mounting the PCB to the chassis, whereby a manufacturing process can be simplified to reduce the manufacturing cost, to prevent the heat transfer from being degraded and to maximize the heat-radiating characteristics.

Figure 3:
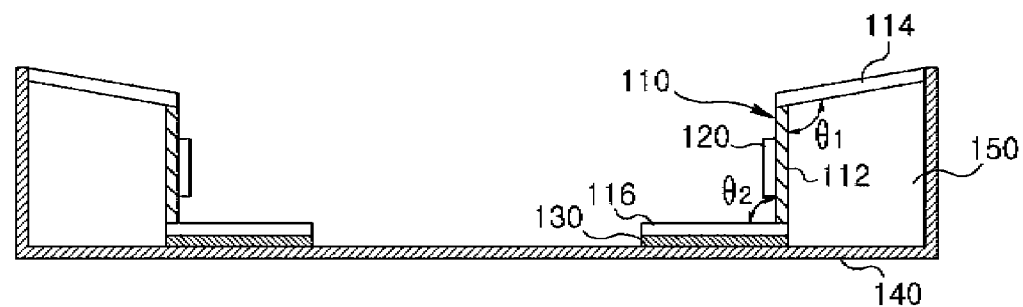
FIG. 3 is a cross-sectional view illustrating a chassis assembly mounted with a heat-radiating PCB according to a second exemplary embodiment of the present invention.

FIG. 3 is a cross-sectional view illustrating a chassis assembly mounted with a heat-radiating PCB according to a second exemplary embodiment of the present invention.

Referring to FIG. 3, the heat-radiating PCB according to the second exemplary embodiment of the present invention may include a circuit pattern unit 112 formed with a circuit pattern, a first mounting unit 114 bent from a distal end of the circuit pattern unit 112 to be fixed at a lateral surface of the chassis 140 having an obtuse angle θ1 at a rear surface of the circuit pattern unit 112, and a second mounting unit 116 bent from the other distal end of the circuit pattern unit 112 to be fixed at the floor surface of the chassis 140.

A space 150 may be formed between the PCB 110 and the chassis, and the chip mounting unit installed at the circuit pattern unit 112 may be provided with a light emitting diode 120 as a light source of the backlight unit.

Figure 4:
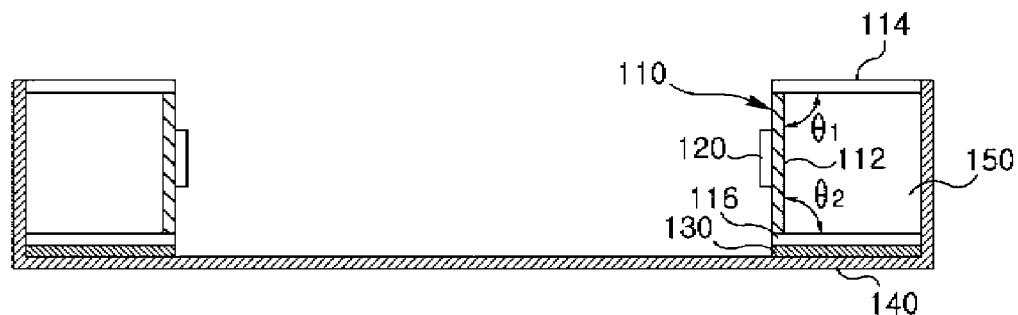
FIG. 4 is a cross-sectional view illustrating a chassis assembly mounted with a heat-radiating PCB according to a third exemplary embodiment of the present invention.

FIG. 4 is a cross-sectional view illustrating a chassis assembly mounted with a heat-radiating PCB according to a third exemplary embodiment of the present invention. Referring to FIG. 4, the heat-radiating PCB 110 according to the third exemplary embodiment of the present invention may include a circuit pattern unit 112 formed with a circuit pattern, a first mounting unit 114 bent from a distal end of the circuit pattern unit 112 to be fixed at a lateral surface of the chassis 140, and a second mounting unit 116 bent from the other distal end of the circuit pattern unit 112 in the same direction with that of the first mounting unit 112 to be fixed at the floor surface of the chassis 140.

At this time, the first mounting unit 114 and the second mounting unit 116 face each other, where an angle between θ1 the first mounting unit 114 and the circuit pattern unit 112 may be a right angle, and an angle θ2 between the second mounting unit 116 and the circuit pattern unit 116 may be also a right angle.

A space 150 may be formed between the PCB 110 and the chassis, and the chip mounting unit installed at the circuit pattern unit 112 may be provided with a light emitting diode 120 as a light source of the backlight unit.

Figure 5:
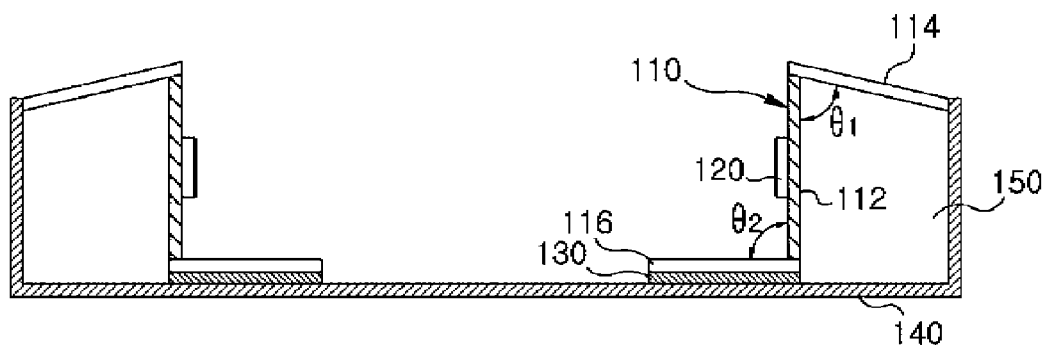
FIG. 5 is a cross-sectional view illustrating a chassis assembly mounted with a heat-radiating PCB according to a fourth exemplary embodiment of the present invention.

FIG. 5 is a cross-sectional view illustrating a chassis assembly mounted with a heat-radiating PCB according to a fourth exemplary embodiment of the present invention. Referring to FIG. 5, the heat-radiating PCB 110 according to the fourth exemplary embodiment of the present invention may include a circuit pattern unit 112 formed with a circuit pattern, a first mounting unit 114 bent from a distal end of the circuit pattern unit 112 to be fixed at a lateral surface of the chassis 140 and having an obtuse angle θ1 at a rear surface of the circuit pattern unit 112, and a second mounting unit 116 bent from the other distal end of the circuit pattern unit 112 at a right angle to be fixed at the floor surface of the chassis 140.

A space 150 may be formed between the PCB 110 and the chassis, and the chip mounting unit installed at the circuit pattern unit 112 may be provided with a light emitting diode 120 as a light source of the backlight unit.

Figure 6:
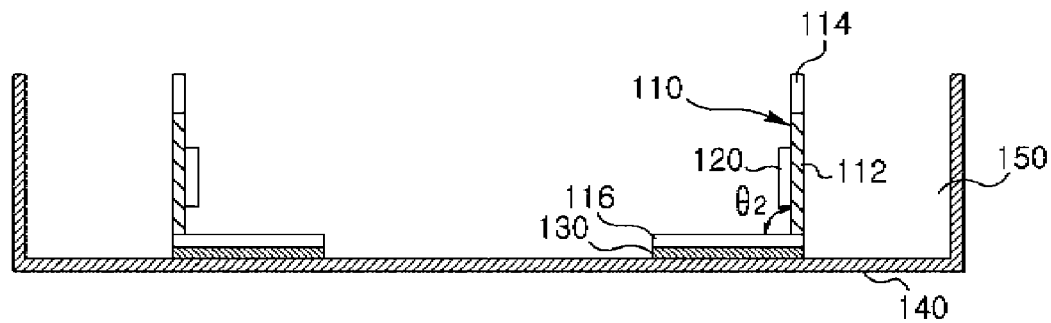
FIG. 6 is a cross-sectional view illustrating a chassis assembly mounted with a heat-radiating PCB according to a fifth exemplary embodiment of the present invention.

FIG. 6 is a cross-sectional view illustrating a chassis assembly mounted with a heat-radiating PCB according to a fifth exemplary embodiment of the present invention. Referring to FIG. 6, the heat-radiating PCB 110 according to the fifth exemplary embodiment of the present invention may include a mounting unit 116 mounted with a chassis 140 at a bottom surface of a circuit pattern unit 112 formed with a circuit pattern. The mounting unit 116 is bent at a right angle from the circuit pattern unit 112 to be installed at a floor surface of the chassis 140 using TIM 130.

An upper side-opened space 150 may be formed between the circuit pattern unit 112 and the lateral surface of the chassis 140, and fixed at the bottom end of the chassis 140 using TIM 130, and the chip mounting unit installed at the circuit pattern unit 112 may be provided with a light emitting diode 120 as a light source of the backlight unit.

While the present disclosure has been particularly shown and described with reference to exemplary embodiments thereof, the general inventive concept is not limited to the above-described embodiments. It will be understood by those of ordinary skill in the art that various changes and variations in form and details may be made therein without departing from the spirit and scope of the present invention as defined by the following claims.

INDUSTRIAL APPLICABILITY

The heat-radiating PCB (printed circuit board) and a chassis assembly having the same according to the present invention have an industrial applicability in that the heat-radiating PCB and a bracket are integrated to prevent degraded heat transfer caused by use of TIM (thermal interface material) and to reduce generation of interface, whereby a thermal conduction degradation phenomenon caused by an air layer can be prevented to maximize the heat-radiating characteristics of the heat-radiating PCB.

Another industrial applicability is that the bracket is integrally manufactured with the heat-radiating PCB to simplify the structure and process by dispensing with separate bracket manufacturing process.

Still another industrial applicability is that the TIM is dispensed with between the heat-radiating PCB and the bracket to reduce use of the TIM and to dispense with the bracket, thereby reducing the manufacturing cost.

Still further industrial applicability is that generation of delamination caused by adhesion problem between the PCB and the bracket can be dispensed with.

The invention claimed is:

1. A heat-radiating printed circuit board comprising:
a metal substrate having a first prescribed area and a second prescribed area;
an insulation layer on the metal substrate;
a circuit pattern on the insulation layer; and
at least one LED on the circuit pattern, wherein
the insulation layer and the circuit pattern are formed sequentially on the metal surface such that the insulation layer and the metal substrate directly contact one another,
the metal substrate is bent between the first prescribed area and the second prescribed area,
the metal substrate of the first prescribed area, the insulation layer on the first prescribed area and the circuit pattern form a circuit pattern unit, and
the circuit pattern is only formed over the first prescribed area.

2. The heat-radiating printed circuit board of claim 1, wherein the insulation layer is only formed on the first prescribed area of the metal substrate.

3. The heat-radiating printed circuit board of claim 1, wherein the insulation layer and the circuit pattern directly contact one another.

4. The heat-radiating printed circuit board of claim 1, wherein the metal substrate is bent such that an angle between the first prescribed area and the second prescribed area is substantially 90 degrees.

5. The heat-radiating printed circuit board of claim 1, wherein the metal substrate is aluminum.

6. The heat-radiating printed circuit board of claim 1, wherein the at least one LED directly contacts the circuit pattern.

7. The heat-radiating printed circuit board of claim 1, wherein the first prescribed area is flat after the metal substrate is bent.

8. The heat-radiating printed circuit board of claim 1, wherein the second prescribed area is flat after the metal substrate is bent.

9. The heat-radiating printed circuit board of claim 1, wherein the at least one LED is formed only over the first prescribed area.

10. The heat-radiating printed circuit board of claim 1, wherein the metal substrate has a first surface and a second surface, which are opposing surfaces, the first and second prescribed areas being provided on the first surface, and the second surface provides mounting for external attachment of the heat radiating printed circuit board.

11. The heat-radiating printed circuit board of claim 1, wherein the second prescribed area of the metal substrate forms a mounting unit for external attachment of the heat-radiating printed circuit board.

12. The heat-radiating printed circuit board of claim 1, wherein the metal substrate further comprises a third prescribed area, the first prescribed area provided between the second and third prescribed areas.

13. The heat-radiating printed circuit board of claim 12, wherein the metal substrate is bent between the first and third prescribed areas such that an angle between the first and third prescribed areas is one of substantially 90 degrees and an angle different from 90 degrees.

14. The heat-radiating printed circuit board of claim 13, wherein the third prescribed area is bent in the same direction as the second prescribed area.

15. The heat-radiating printed circuit board of claim 13, wherein the third prescribed area is bent in the opposite direction to the second prescribed area.

16. A chassis assembly, comprising:
a chassis providing a light guide path of a back light unit; and a heat-radiating printed circuit board mounted at the chassis,
wherein the heat-radiating printed circuit board includes
a metal substrate having a first prescribed area and a second prescribed area;
an insulation layer on the metal substrate;
a circuit pattern on the insulation layer; and
at least one LED on the circuit pattern, wherein
the insulation layer and the circuit pattern are formed sequentially on the metal surface such that the insulation layer and the metal substrate directly contact one another,
the metal substrate is bent between the first prescribed area and the second prescribed area,
the metal substrate of the first prescribed area, the insulation layer on the first prescribed area and the circuit pattern form a circuit pattern unit, and
the circuit pattern is only formed over the first prescribed area
wherein the second prescribed area of the metal substrate forms a mounting unit for attachment of the heat-radiating printed circuit board to the chassis.

17. A chassis assembly of claim 16, wherein the metal substrate has a first surface and a second surface, which are opposing surfaces, the first and second prescribed areas being provided on the first surface, and the second surface provides mounting for attachment of the heat radiating printed circuit board to the chassis.

18. A chassis assembly of claim 16, wherein the insulation layer and the circuit pattern directly contact one another.

19. A chassis assembly of claim 18, wherein the at least one LED directly contacts the circuit pattern.

20. A chassis assembly of claim 16, wherein the metal substrate is aluminum.

* * * * *